United States Patent
Suzuki

(10) Patent No.: US 10,872,877 B2
(45) Date of Patent: Dec. 22, 2020

(54) METHOD OF MANUFACTURING SEMICONDUCTOR DEVICE

(71) Applicant: Mitsubishi Electric Corporation, Tokyo (JP)

(72) Inventor: Erubi Suzuki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/502,055

(22) Filed: Jul. 3, 2019

(65) Prior Publication Data

US 2020/0227381 A1    Jul. 16, 2020

(30) Foreign Application Priority Data

Jan. 15, 2019  (JP) .................. 2019-004633

(51) Int. Cl.
*H01L 23/00* (2006.01)
(52) U.S. Cl.
CPC .... *H01L 24/85* (2013.01); *H01L 2224/85205* (2013.01); *H01L 2224/85345* (2013.01)

(58) Field of Classification Search
CPC ............ H01L 2224/85345; H01L 2224/85205
See application file for complete search history.

(56) References Cited

U.S. PATENT DOCUMENTS

2017/0207179 A1* 7/2017 Kitajima ........... H01L 23/49558

FOREIGN PATENT DOCUMENTS

JP         2016-134547 A     7/2016

* cited by examiner

*Primary Examiner* — Selim U Ahmed
*Assistant Examiner* — Evan G Clinton
(74) *Attorney, Agent, or Firm* — Studebaker & Brackett PC

(57) ABSTRACT

A method of manufacturing a semiconductor device includes: forming a first electrode and a second electrode on an insulating layer so as to be apart from each other; forming a barrier made of same material as a metal terminal on a peripheral portion of an ultrasonic bonding portion of the metal terminal; and applying pressing force and ultrasonic vibration to the ultrasonic bonding portion of the metal terminal by using an ultrasonic tool to ultrasonically bond the metal terminal to the first electrode.

19 Claims, 11 Drawing Sheets

METAL DUST PROGRESS DIRECTION

METAL DUST PROGRESS DIRECTION

METHOD OF MANUFACTURING SEMICONDUCTOR DEVICE

BACKGROUND OF THE INVENTION

Field

The present invention relates to a method of manufacturing a semiconductor device.

Background

When a metal terminal is ultrasonically bonded to an electrode, pressing force and ultrasonic vibration are applied to the metal terminal by using an ultrasonic tool. A technique in which a material having a linear expansion coefficient different from that of the metal terminal is provided to an ultrasonic bonding portion of the metal terminal has been proposed (see JP 2016-134547 A, for example), however, it has a problem that the manufacturing cost increases.

SUMMARY

In the ultrasonic bonding, metal dust is generated in a process in which the metal terminal is processed and deformed by ultrasonic vibration and pressing force. The metal dust may short-circuit with an adjacent electrode to cause a defect. Therefore, it has been necessary to add a work of removing the metal dust after the process has been completed. In addition, in order to suppress generation of metal dust, it has been necessary to devise the shape of an ultrasonic tool, process condition or the like. Therefore, there has been a problem that the manufacturing cost increases and the degree of freedom of the process condition is degraded.

The present invention has been made to solve the above-described problems, and has an object to provide a method of manufacturing a semiconductor device that is capable of preventing a defect, reducing a manufacturing cost, and increasing the degree of freedom of the process condition.

A method of manufacturing a semiconductor device according to the present invention includes: forming a first electrode and a second electrode on an insulating layer so as to be apart from each other; forming a barrier made of same material as a metal terminal on a peripheral portion of an ultrasonic bonding portion of the metal terminal; and applying pressing force and ultrasonic vibration to the ultrasonic bonding portion of the metal terminal by using an ultrasonic tool to ultrasonically bond the metal terminal to the first electrode.

In the present invention, the barrier is formed at the peripheral portion of the ultrasonic bonding portion of the metal terminal. The barrier blocks the metal dust generated in ultrasonic bonding. Therefore, the metal dust can be prevented from short-circuiting with the adjacent second electrode and causing a defect, which enables the distance between the first electrode and the second electrode to be reduced, thus the semiconductor device can be miniaturized.

Furthermore, since there is no need to devise the shape of the ultrasonic tool, process condition or the like, the degree of freedom of the process condition can be increased. In addition, there is no need to remove the metal dust after the process is completed. Since the barrier is made of the same material as the metal terminal, the manufacturing is easy. Therefore, the manufacturing cost can be reduced.

Other and further objects, features and advantages of the invention will appear more fully from the following description.

DESCRIPTION OF EMBODIMENTS

A method of manufacturing a semiconductor device according to the embodiments of the present invention will be described with reference to the drawings. The same components will be denoted by the same symbols, and the repeated description thereof may be omitted.

First Embodiment

Figure 1:
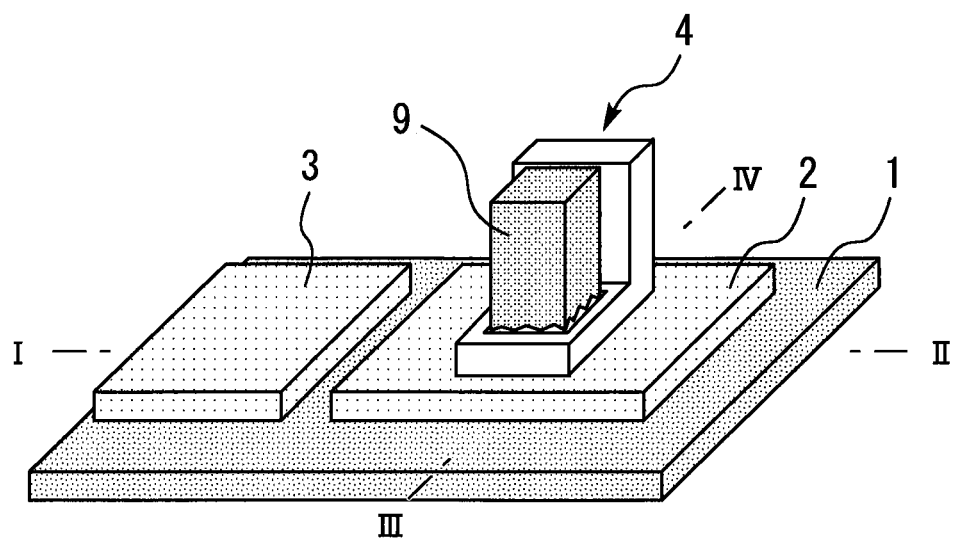
FIG. 1 is a perspective view showing a method of manufacturing a semiconductor device according to a first embodiment.
Figure 2:
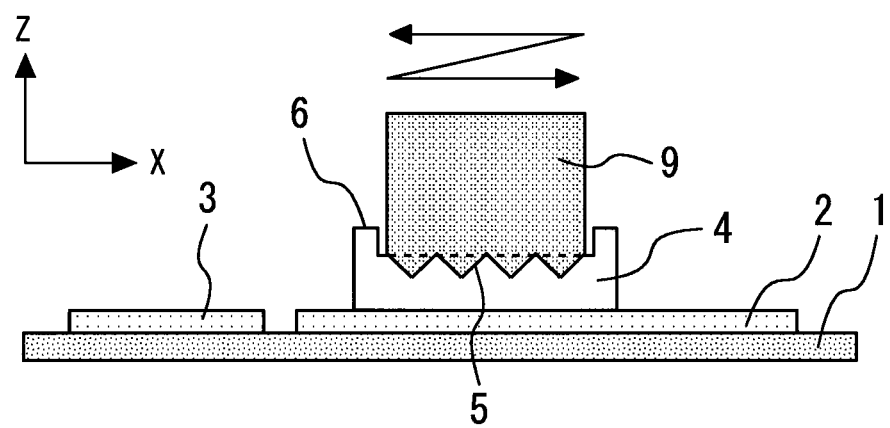
FIG. 2 is a cross-sectional view taken along line I-II of FIG. 1.
Figure 3:
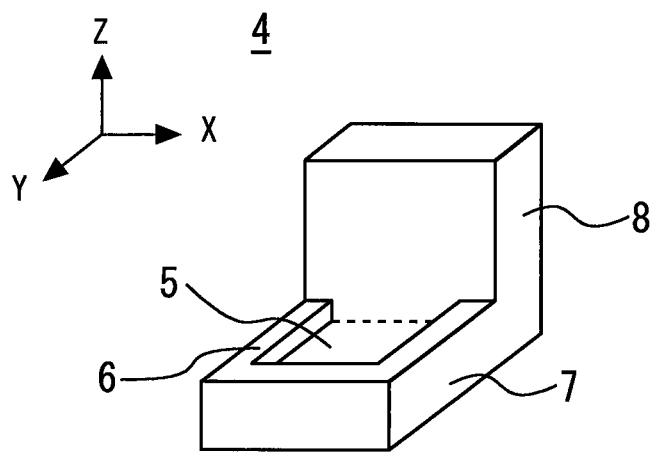
FIG. 3 is a perspective view showing a metal terminal according to the first embodiment.
Figure 4:
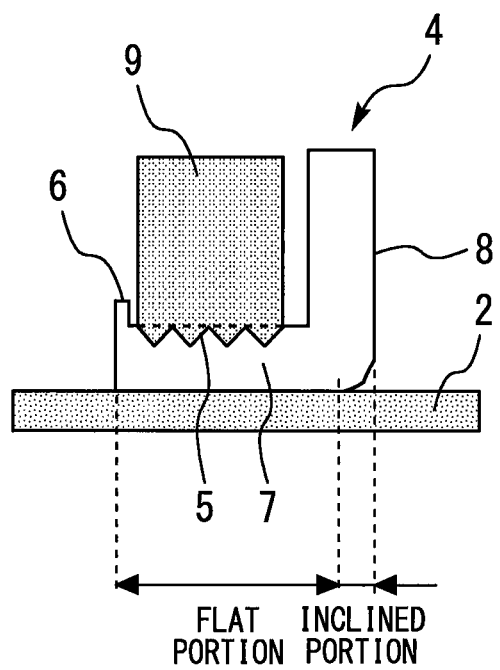
FIG. 4 is a cross-sectional view taken along a line III-IV of FIG. 1.

FIG. 1 is a perspective view showing a method of manufacturing a semiconductor device according to a first embodiment. FIG. 2 is a cross-sectional view taken along line I-II of FIG. 1. FIG. 3 is a perspective view showing a metal terminal according to the first embodiment. FIG. 4 is a cross-sectional view taken along a line III-IV of FIG. 1.

First, a first electrode 2 and a second electrode 3 are formed on an insulating layer 1 so as to be apart from each other. Here, the insulating layer 1 is an insulating substrate or the like of a semiconductor device, and insulates the first electrode 2 and the second electrode 3 from each other. In a completed semiconductor device, since current flows independently to each of the first electrode 2 and the second electrode 3, the first electrode 2 and the second electrode 3 are required to be electrically insulated from each other.

A barrier 6 made of the same material as a metal terminal 4 is formed on a peripheral portion of an ultrasonic bonding portion 5 of the metal terminal 4, for example, by pressing or the like. The metal terminal 4 has a tip portion 7 including the ultrasonic bonding portion 5 and a main body portion 8 which is bent upward with respect to the tip portion 7. The barrier 6 is formed on three direction sides of the peripheral portion of the ultrasonic bonding portion 5 except for the side of the main body portion 8. The inner surface of the barrier 6 is perpendicular to the upper surface of the metal terminal 4.

Next, the tip of the ultrasonic tool 9 is brought into contact with the upper surface of the ultrasonic bonding portion 5, and pressing force and ultrasonic vibration are applied to the ultrasonic bonding portion 5 of the metal terminal 4 by using the ultrasonic tool 9. As a result, the metal terminal 4 is ultrasonically bonded to the first electrode 2. The direction of the ultrasonic vibration may be one direction or two directions. The ultrasonic bonding portion 5 is required to be larger than the tip of the ultrasonic tool 9 so that the ultrasonic tool 9 and the barrier 6 do not interfere with each other.

Figure 5:
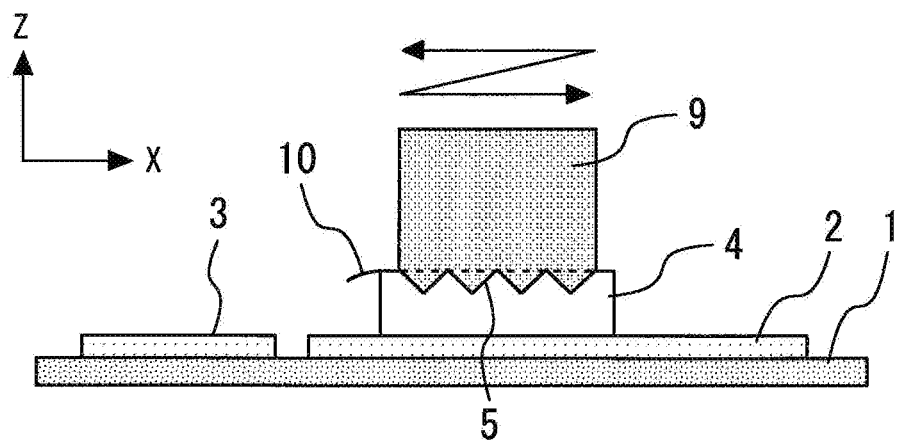
FIG. 5 is a cross-sectional view showing a state where ultrasonic bonding is performed by a method of manufacturing a semiconductor device according to the comparative example.
Figure 6:
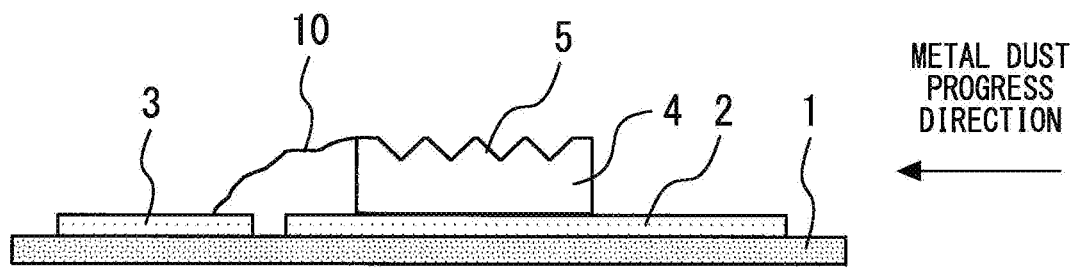
FIG. 6 is a cross-sectional view showing a state where ultrasonic bonding is performed by a method of manufacturing a semiconductor device according to the comparative example.

Subsequently, the effect of the present embodiment will be described in comparison with a comparative example. FIGS. 5 and 6 are cross-sectional views showing a state where ultrasonic bonding is performed by a method of manufacturing a semiconductor device according to the comparative example. As shown in FIG. 5, when pressing force and ultrasonic vibration are applied to the ultrasonic bonding portion 5 of the metal terminal 4 by using the ultrasonic tool 9, metal dust 10 is generated. In the comparative example, the barrier 6 for blocking the metal dust 10 is not formed. Therefore, as shown in FIG. 6, the metal dust 10 progresses in a lateral direction and short-circuits with the adjacent second electrode 3 to cause a defect.

Figure 7:
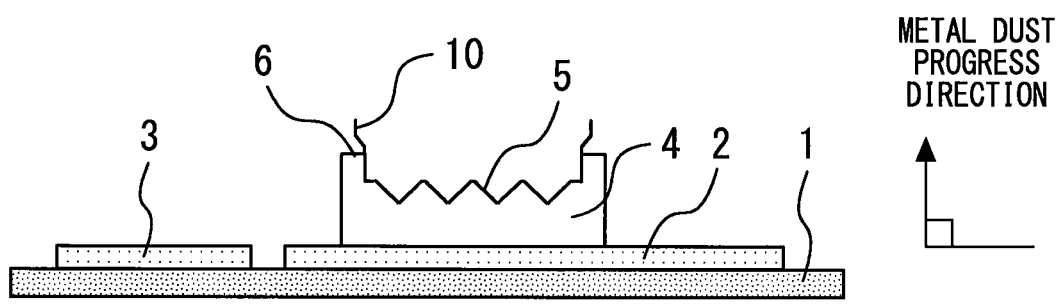
FIG. 7 is a cross-sectional view showing a state where the metal terminal has been ultrasonically bonded by the method of manufacturing a semiconductor device according to the first embodiment.

FIG. 7 is a cross-sectional view showing a state where the metal terminal has been ultrasonically bonded by the method of manufacturing a semiconductor device according to the first embodiment. In the present embodiment, the barrier 6 is formed at the peripheral portion of the ultrasonic bonding portion 5 of the metal terminal 4. The barrier 6 blocks the metal dust 10 generated in ultrasonic bonding, and the metal dust 10 grows in the vertical direction. Therefore, the metal dust 10 can be prevented from short-circuiting with the adjacent second electrode 3 and causing a defect, which enables the distance between the first electrode 2 and the second electrode 3 to be reduced. Thus, the semiconductor device can be miniaturized.

Furthermore, since there is no need to devise the shape of the ultrasonic tool 9, process condition or the like, the degree of freedom of the process condition can be increased. In addition, there is no need to remove the metal dust 10 after the process is completed. Since the barrier 6 is made of the same material as the metal terminal 4, the manufacturing is easy. Therefore, the manufacturing cost can be reduced.

The metal dust 10 directed from the ultrasonic bonding portion 5 to the main body portion 8 of the metal terminal 4 is blocked by the main body 8. Therefore, the barrier 6 is not provided on the side of the main body portion 8 at the peripheral portion of the ultrasonic bonding portion 5. Thus, the material cost can be reduced.

The metal terminal 4 is bent between the tip portion 7 and the main body 8, and at this bent portion, the lower surface of the metal terminal 4 forms an inclined portion. On the other hand, the lower surface of the tip portion 7 of the metal terminal 4 is a flat surface extending to the tip of the metal terminal 4. As a result, the contact area between the metal terminal 4 and the first electrode 2 increases, thus the bonding strength can be enhanced.

Figure 8:
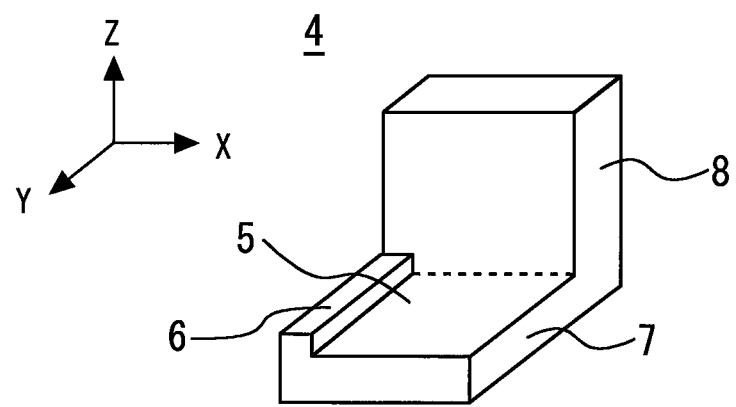
FIG. 8 is a perspective view showing a modification of the metal terminal according to the first embodiment.
Figure 9:
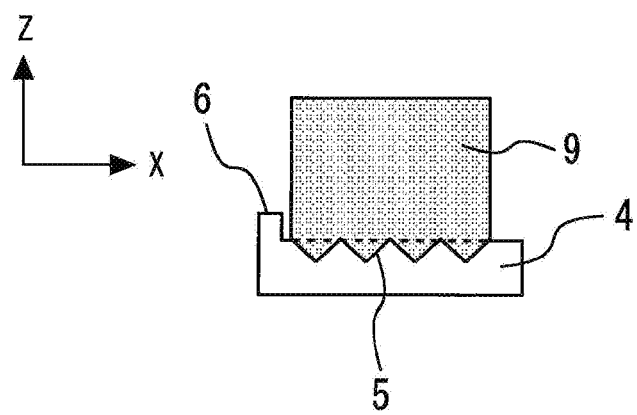
FIG. 9 is a cross-sectional view showing a state where the ultrasonic tool is pressed against a modification of the metal terminal according to the first embodiment.
Figure 10:
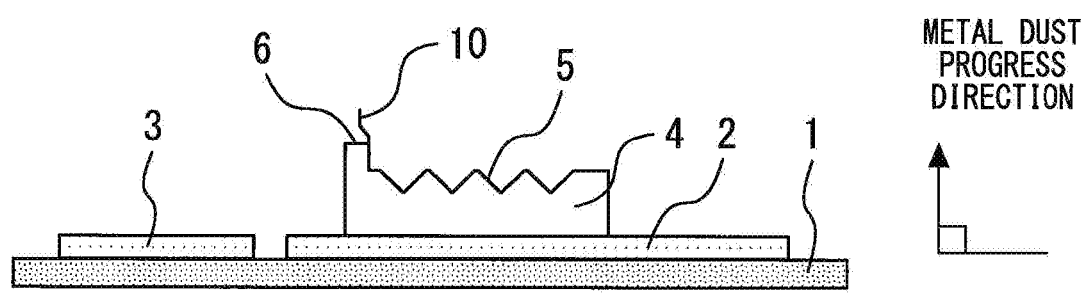
FIG. 10 is a cross-sectional view showing a state where ultrasonic bonding is performed by a modification of the method of manufacturing a semiconductor device according to the first embodiment.

FIG. 8 is a perspective view showing a modification of the metal terminal according to the first embodiment. FIG. 9 is a cross-sectional view showing a state where the ultrasonic tool is pressed against a modification of the metal terminal according to the first embodiment. FIG. 10 is a cross-sectional view showing a state where ultrasonic bonding is performed by a modification of the method of manufacturing a semiconductor device according to the first embodiment. The barrier 6 is formed only on the side of the second electrode 3 at the peripheral portion of the ultrasonic bonding portion 5. The material cost can be reduced by setting the number of barriers 6 to the minimum necessary number as described above. The other configurations and effects are similar to those of the second embodiment. Note that when the second electrodes 3 are provided on two direction sides with respect to the metal terminal 4, the barriers 6 are provided only on two sides of the second electrodes 3 at the peripheral portion of the ultrasonic bonding portion 5.

Second Embodiment

Figure 11:
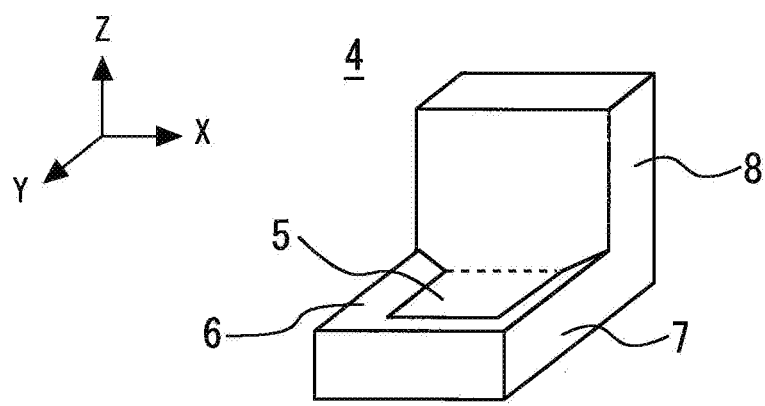
FIG. 11 is a perspective view showing a metal terminal according to a second embodiment.
Figure 12:
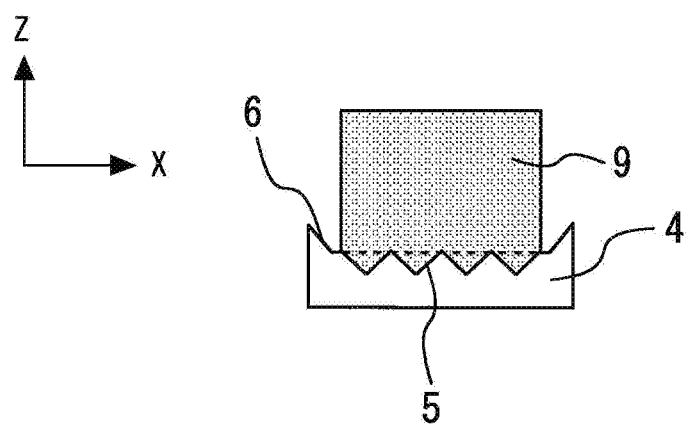
FIG. 12 is a cross-sectional view showing a state where the ultrasonic tool is pressed against a metal terminal according to the second embodiment.
Figure 13:
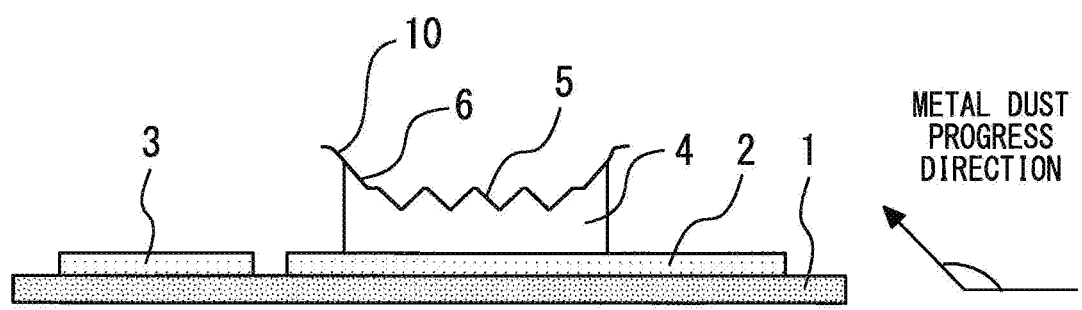
FIG. 13 is a cross-sectional view showing a state where the metal terminal is ultrasonically bonded by a method of manufacturing a semiconductor device according to the second embodiment.

FIG. 11 is a perspective view showing a metal terminal according to a second embodiment. FIG. 12 is a cross-sectional view showing a state where the ultrasonic tool is pressed against a metal terminal according to the second embodiment. FIG. 13 is a cross-sectional view showing a state where the metal terminal is ultrasonically bonded by a method of manufacturing a semiconductor device according to the second embodiment.

In the present embodiment, the inner surface of the barrier 6 is tapered. As a result, the generated metal dust 10 progresses obliquely upward with respect to the second electrode 3, thus the metal dust 10 can be prevented from short-circuiting with the adjacent second electrode 3. Furthermore, since the inner surface of the barrier 6 is not limited to a vertical surface, choices for selection of the method of forming the barrier 6 are increased.

Figure 14:
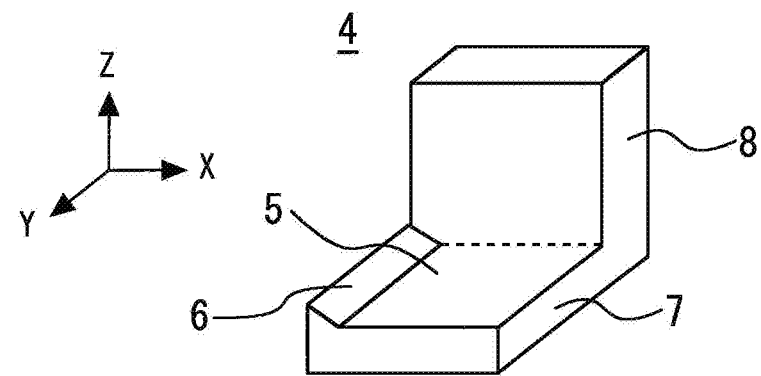
FIG. 14 is a perspective view showing a modification of the metal terminal according to the second embodiment.
Figure 15:
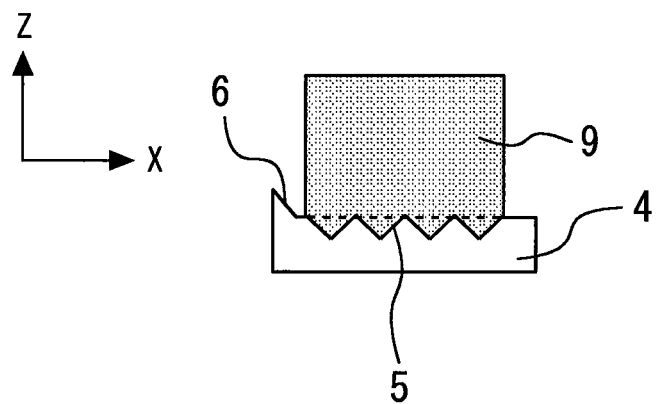
FIG. 15 is a cross-sectional view showing a state where the ultrasonic tool is pressed against a modification of the metal terminal according to the second embodiment.
Figure 16:
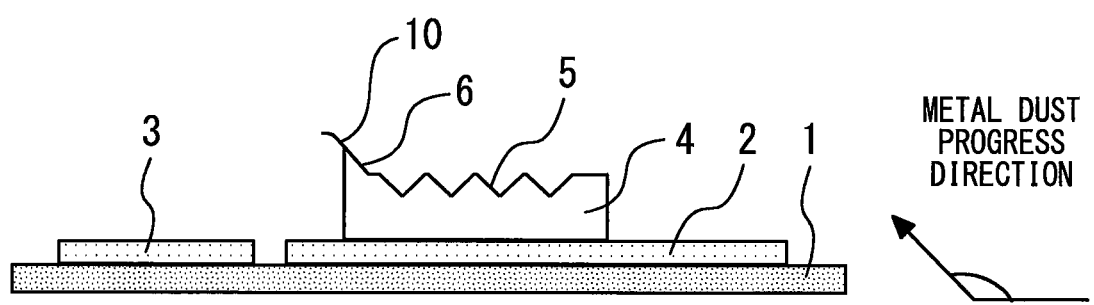
FIG. 16 is a cross-sectional view showing a state where ultrasonic bonding is performed by a modification of the method of manufacturing a semiconductor device according to the second embodiment.

FIG. 14 is a perspective view showing a modification of the metal terminal according to the second embodiment. FIG. 15 is a cross-sectional view showing a state where the ultrasonic tool is pressed against a modification of the metal terminal according to the second embodiment. FIG. 16 is a cross-sectional view showing a state where ultrasonic bonding is performed by a modification of the method of manufacturing a semiconductor device according to the second embodiment. The barrier 6 is formed only on the side of the second electrode 3 at the peripheral portion of the ultrasonic bonding portion 5. The material cost can be reduced by setting the number of barriers 6 to the minimum necessary number as described above. The other configurations and effects are the same as those of the second embodiment. Note that when the second electrodes 3 are provided on two direction sides with respect to the metal terminal 4, the barriers 6 are provided only on the two sides of the second electrodes 3 at the peripheral portion of the ultrasonic bonding portion 5.

Third Embodiment

Figure 17:
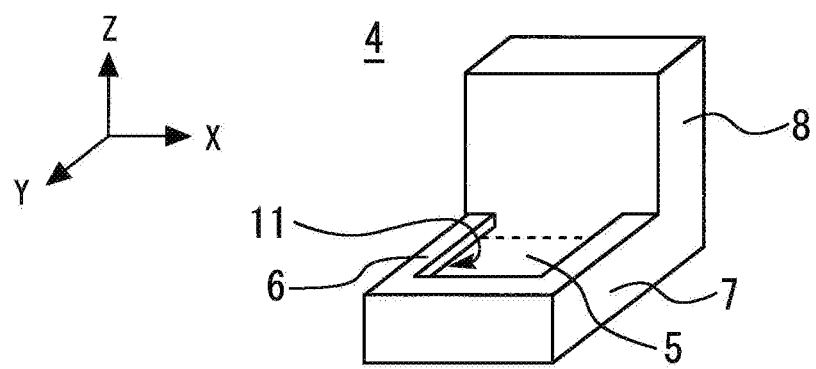
FIG. 17 is a perspective view showing a metal terminal according to a third embodiment.
Figure 18:
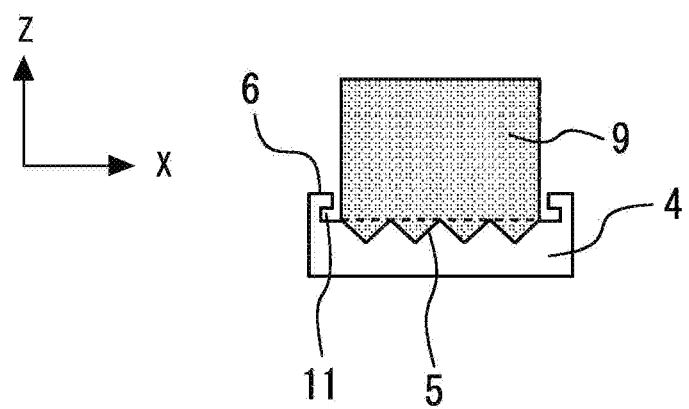
FIG. 18 is a cross-sectional view showing a state where the ultrasonic tool is pressed against the metal terminal according to the third embodiment.
Figure 19:
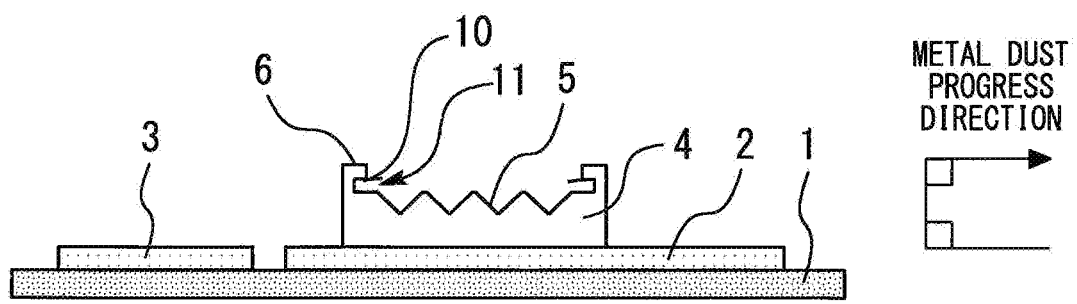
FIG. 19 is a cross-sectional view showing a state where the metal terminal is ultrasonically bonded by a method of manufacturing a semiconductor device according to the third embodiment.

FIG. 17 is a perspective view showing a metal terminal according to a third embodiment. FIG. 18 is a cross-sectional view showing a state where the ultrasonic tool is pressed against the metal terminal according to the third embodiment. FIG. 19 is a cross-sectional view showing a state where the metal terminal is ultrasonically bonded by a method of manufacturing a semiconductor device according to the third embodiment.

In the present embodiment, a concaved portion 11 is provided on the lower side of the inner surface of the barrier 6, and the inner surface is U-shaped. As a result, the generated metal dust 10 progresses along the inner wall of the concave portion 11 of the inner surface of the barrier 6, and returns in a direction to the ultrasonic bonding portion 5. Therefore, the metal dust 10 can be prevented from short-circuiting with the adjacent second electrode 3. The other configurations and effects are similar to those of the first embodiment.

Figure 20:
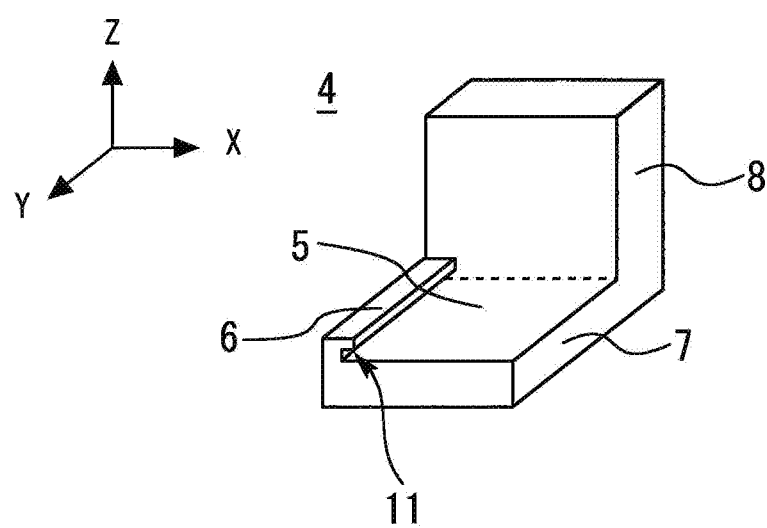
FIG. 20 is a perspective view showing a modification of the metal terminal according to the third embodiment.
Figure 21:
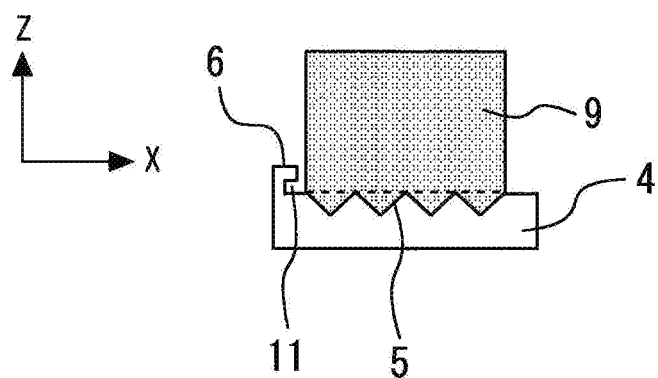
FIG. 21 is a cross-sectional view showing a state where the ultrasonic tool is pressed against a modification of the metal terminal according to the third embodiment.
Figure 22:
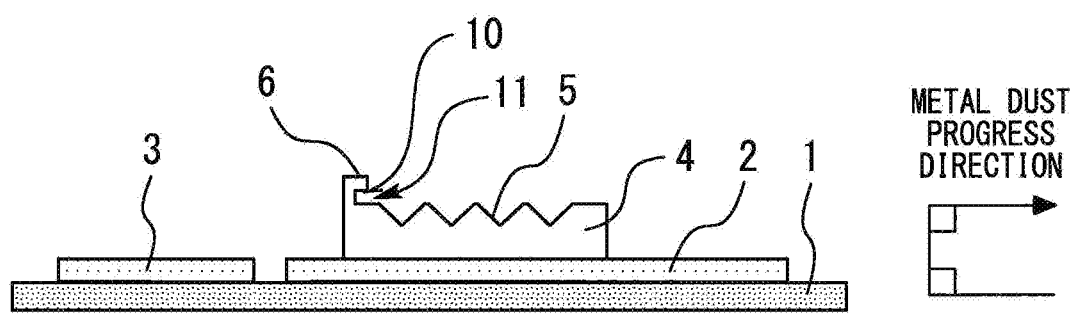
FIG. 22 is a cross-sectional view showing a state where ultrasonic bonding is performed by a modification of the method of manufacturing a semiconductor device according to the third embodiment.

FIG. 20 is a perspective view showing a modification of the metal terminal according to the third embodiment. FIG. 21 is a cross-sectional view showing a state where the ultrasonic tool is pressed against a modification of the metal terminal according to the third embodiment. FIG. 22 is a cross-sectional view showing a state where ultrasonic bonding is performed by a modification of the method of manufacturing a semiconductor device according to the third embodiment. The barrier 6 is formed only on the side of the second electrode 3 at the peripheral portion of the ultrasonic bonding portion 5. As described above, the material cost can be reduced by setting the number of barriers 6 to the minimum necessary number. The other configurations and effects are the same as those of the third embodiment. When the second electrodes 3 are provided on two direction sides with respect to the metal terminal 4, the barriers 6 are provided only on the two sides of the second electrodes 3 at the peripheral portion of the ultrasonic bonding portion 5.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2019-004633, filed on Jan. 15, 2019 including specification, claims, drawings and summary, on which the Convention priority of the present application is based, is incorporated herein by reference in its entirety.

The invention claimed is:

1. A method of manufacturing a semiconductor device comprising:
   forming a first electrode and a second electrode on an insulating layer so as to be apart from each other;
   forming a barrier made of same material as a metal terminal on a peripheral portion of an ultrasonic bonding portion of the metal terminal; and
   after forming the barrier, applying pressing force and ultrasonic vibration to the ultrasonic bonding portion of the metal terminal by using an ultrasonic tool to ultrasonically bond the metal terminal to the first electrode.

2. The method of manufacturing a semiconductor device according to claim 1, wherein the metal terminal has a tip portion including the ultrasonic bonding portion and a main body portion bent upward with respect to the tip portion, and the barrier is not formed on a side of the main body portion at the peripheral portion of the ultrasonic bonding portion.

3. The method of manufacturing a semiconductor device according to claim 2, wherein a lower surface of the tip portion of the metal terminal is a flat surface.

4. The method of manufacturing a semiconductor device according to claim 3, wherein an inner surface of the barrier is tapered.

5. The method of manufacturing a semiconductor device according to claim 4, wherein the barrier is formed only on a side of the second electrode at the peripheral portion of the ultrasonic bonding portion.

6. The method of manufacturing a semiconductor device according to claim 3, wherein a concaved portion is formed on a lower side of an inner surface of the barrier.

7. The method of manufacturing a semiconductor device according to claim 6, wherein the barrier is formed only on a side of the second electrode at the peripheral portion of the ultrasonic bonding portion.

8. The method of manufacturing a semiconductor device according to claim 3, wherein the barrier is formed only on a side of the second electrode at the peripheral portion of the ultrasonic bonding portion.

9. The method of manufacturing a semiconductor device according to claim 2, wherein an inner surface of the barrier is tapered.

10. The method of manufacturing a semiconductor device according to claim 9, wherein the barrier is formed only on a side of the second electrode at the peripheral portion of the ultrasonic bonding portion.

11. The method of manufacturing a semiconductor device according to claim 2, wherein a concaved portion is formed on a lower side of an inner surface of the barrier.

12. The method of manufacturing a semiconductor device according to claim 11, wherein the barrier is formed only on a side of the second electrode at the peripheral portion of the ultrasonic bonding portion.

13. The method of manufacturing a semiconductor device according to claim 2, wherein the barrier is formed only on a side of the second electrode at the peripheral portion of the ultrasonic bonding portion.

14. The method of manufacturing a semiconductor device according to claim 1, wherein an inner surface of the barrier is tapered.

15. The method of manufacturing a semiconductor device according to claim 14, wherein the barrier is formed only on one side of the second electrode at the peripheral portion of the ultrasonic bonding portion.

16. The method of manufacturing a semiconductor device according to claim 1, wherein a concaved portion is formed on a lower side of an inner surface of the barrier.

17. The method of manufacturing a semiconductor device according to claim 16, wherein the barrier is formed only on a side of the second electrode at the peripheral portion of the ultrasonic bonding portion.

18. The method of manufacturing a semiconductor device according to claim 1, wherein the barrier is formed only on one side of the second electrode at the peripheral portion of the ultrasonic bonding portion.

19. The method of manufacturing a semiconductor device according to claim 1, wherein the barrier protrudes upward from an uppermost surface of the ultrasonic bonding portion of the metal terminal.

\* \* \* \* \*